(12) United States Patent
Cruz et al.

(10) Patent No.: US 9,627,297 B2
(45) Date of Patent: *Apr. 18, 2017

(54) SOLDER FLOW-IMPEDING PLUG ON A LEAD FRAME

(71) Applicant: INTERSIL AMERICAS LLC, Milpitas, CA (US)

(72) Inventors: Randolph Cruz, Melbourne, FL (US); Loyde Milton Carpenter, Jr., Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/928,358

(22) Filed: Oct. 30, 2015

(65) Prior Publication Data

US 2016/0056093 A1    Feb. 25, 2016

Related U.S. Application Data

(60) Continuation of application No. 14/602,996, filed on Jan. 22, 2015, now Pat. No. 9,177,896, which is a
(Continued)

(51) Int. Cl.
*H01L 23/495*    (2006.01)
*H01L 21/56*    (2006.01)
(Continued)

(52) U.S. Cl.
CPC .... *H01L 23/49513* (2013.01); *H01L 21/4832* (2013.01); *H01L 21/565* (2013.01);
(Continued)

(58) Field of Classification Search
None
See application file for complete search history.

(56) References Cited

U.S. PATENT DOCUMENTS 7,394,150 B2    7/2008    Kasem et al.
8,035,206 B2    10/2011    Cruz
(Continued)

OTHER PUBLICATIONS

U.S. Patent and Trademark Office, "Notice of Allowance", "from U.S. Appl. No. 13/716,956", Dec. 15, 2014, pp. 1-5, Published in: US.

(Continued)

*Primary Examiner* — Michelle Mandala
(74) *Attorney, Agent, or Firm* — Fogg & Powers LLC

(57) ABSTRACT

Embodiments described herein relate to a packaged component including a lead frame and a non-conductive plug disposed between two or more adjacent sections of the lead frame. The plug is composed of a non-conductive material functions to impede the flow of solder along edges of the two or more adjacent sections during second level solder reflow events that occur after encapsulation of the packaged component. The plug includes a main portion disposed within a space between the two or more adjacent sections, and one or more overlap portions extending from the main portion. The one or more overlap portions are disposed on an internal surface of at least one of the two or more adjacent sections. At least one component is mounted on one of the plurality of sections of the lead frame.

9 Claims, 7 Drawing Sheets

Related U.S. Application Data division of application No. 13/716,956, filed on Dec. 17, 2012, now Pat. No. 8,969,137.

(60) Provisional application No. 61/710,753, filed on Oct. 7, 2012.

(51) Int. Cl.
*H01L 21/48* (2006.01)
*H01L 23/31* (2006.01)
*H01L 23/00* (2006.01)

(52) U.S. Cl.
CPC ........ *H01L 23/3107* (2013.01); *H01L 23/495* (2013.01); *H01L 23/49541* (2013.01); *H01L 23/49548* (2013.01); *H01L 23/49562* (2013.01); *H01L 23/49575* (2013.01); *H01L 23/49589* (2013.01); *H01L 24/73* (2013.01); *H01L 2224/32245* (2013.01); *H01L 2224/48247* (2013.01); *H01L 2224/73265* (2013.01); *H01L 2224/92247* (2013.01); *H01L 2924/12032* (2013.01); *H01L 2924/3011* (2013.01)

(56) References Cited

U.S. PATENT DOCUMENTS

| | | |
|---|---|---|
| 8,035,221 B2 | 10/2011 | Cruz |
| 2006/0087010 A1 | 4/2006 | Hong |
| 2009/0283884 A1 | 11/2009 | Kang et al. |
| 2011/0227207 A1* | 9/2011 | Yilmaz ............ H01L 23/49537 257/676 |
| 2012/0032317 A1 | 2/2012 | Cruz |
| 2013/0314879 A1 | 11/2013 | Yin et al. |

OTHER PUBLICATIONS

U.S. Patent and Trademark Office, "Office Action", "from U.S. Appl. No. 13/716,956", Aug. 28, 2014, pp. 1-14, Published in: US.
U.S Patent and Trademark Office, "Restriction Requirement", "from U.S. Appl. No. 13/716,956", Jun. 13, 2014, pp. 1-5, Published in: US.
U.S. Patent and Trademark Office, "Notice of Allowance", "from U.S. Appl. No. 14/602,996", Aug. 20, 2015, pp. 1-10, Published in: US.
Taiwan Intellectual Property Office, "Office Action from TW Application No. 102135780 mailed Nov. 11, 2015", "from Foreign Counterpart of U.S. Appl. No. 13/716,956", Nov. 11, 2015, pp. 1-7, Published in: TW.

\* cited by examiner

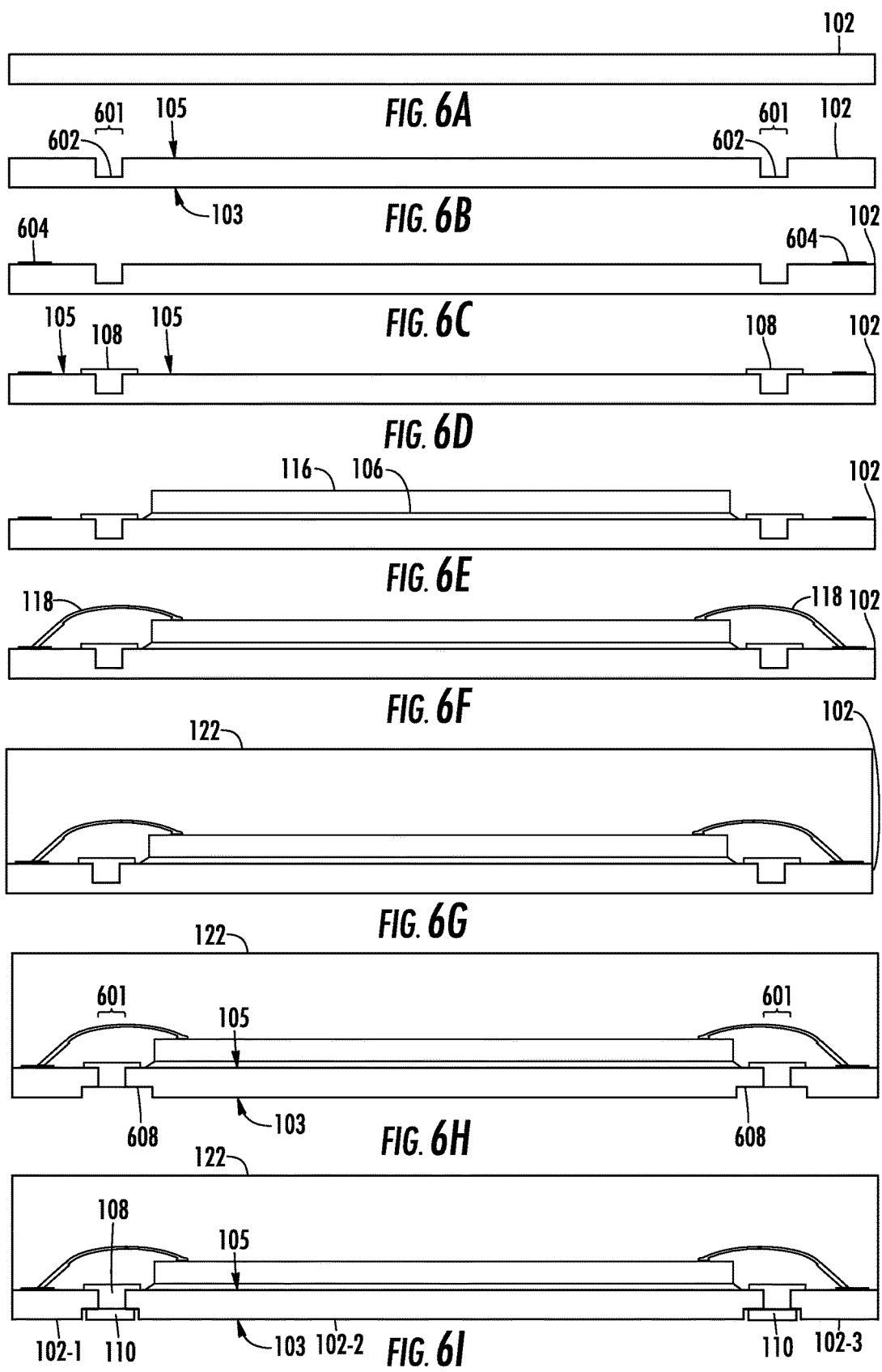

SOLDER FLOW-IMPEDING PLUG ON A LEAD FRAME

CROSS-REFERENCE TO RELATED APPLICATIONS

This application is a continuation of U.S. application Ser. No. 14/602,996, filed on Jan. 22, 2015, which is a divisional of U.S. application Ser. No. 13/716,956, filed on Dec. 17, 2012, which claims the benefit of priority to U.S. Provisional Application No. 61/710,753, filed on Oct. 7, 2012. U.S. application Ser. No. 14/602,996, U.S. application Ser. No. 13/716,956, and U.S. Provisional Application No. 61/710,753 are hereby incorporated herein by reference.

BRIEF DESCRIPTION OF THE DRAWINGS

FIGS. 6A-6I are cross-sectional views of example stages in a method of manufacturing a packaged circuit including a solder flow-impeding plug.

DETAILED DESCRIPTION

Figure 1A:
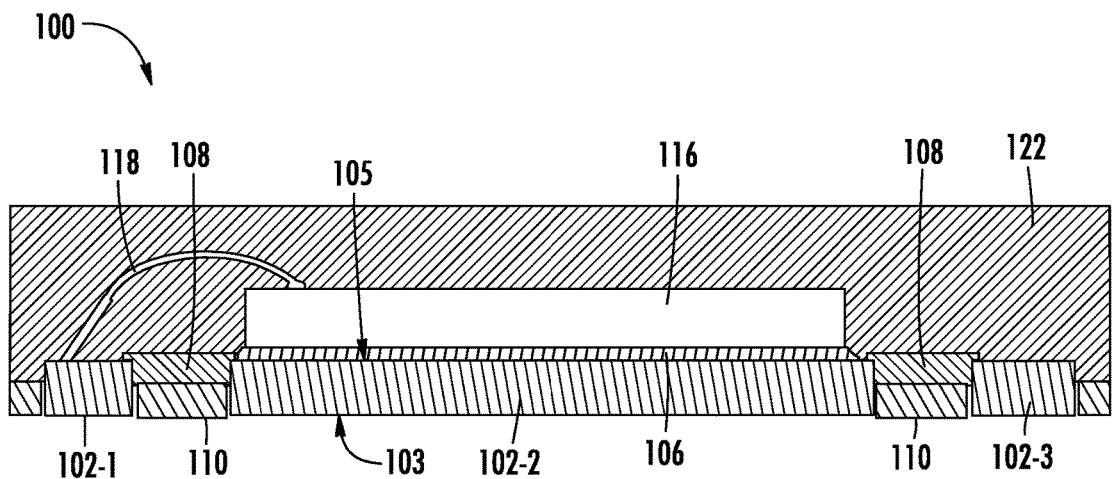
FIG. 1A is a cross-sectional view of an embodiment of a packaged circuit including a lead frame with a solder flow-impeding plug.

FIG. 1A is a cross-sectional view of an embodiment of a packaged circuit 100 including a lead frame 102 with a solder flow-impeding plug 108. The lead frame 102 of the circuit 100 is composed of a plurality of distinct, electrically isolated, and generally planar sections 102-1, 102-2, 102-3 of conductive material. The sections 102-1, 102-2, 102-3 of conductive material are oriented such that the sections collectively have a generally planar configuration. Each section 102-1, 102-2, 102-3 comprises two primary surfaces: an external surface 103 and an internal surface 105. The external surface 103 includes a plurality of external terminals for coupling the lead frame to external circuits, and the internal surface 105 includes one or more pads for mounting of one or more components 116. In an example, one or more of the sections (102-1, 102-2, 102-3) of conductive material can be floating, that is, one or more sections of conductive material do not abut an edge (perimeter) of the package of the packaged circuit 100. An example of a floating section is section 530 of a lead frame 102 shown in FIG. 5, which is described in more detail below. The lead frame 102 is composed of an electrically conductive material such as a metal. In an example, the lead frame 102 is composed of copper.

As shown in FIG. 1A, one or more components 116 (also referred to herein as simply "component 116") are mounted to the internal surface of the lead frame 102. The one or more components 116 can include one or more dies and/or one or more discrete devices such as an inductor, a resistor, or a capacitor. In an example, the packaged circuit 100 includes multiple dies in a multichip package such as, for example, to implement a power conversion system. The power conversion system can include a power stage as well as a controller and/or driver for the power stage. For example, the component 116 can include one or more of a high side FET, low side FET, or a diode (e.g., Schottky diode). Other components such as a power inductor or passive components can also be mounted on the lead frame 102. In an example, the power conversion system can comprise a DC-to-DC power converter, a charger, a hot-swap controller, an AC-DC converter, a bridge driver, a buck converter, a boost converter, a buck-boost converter, a synchronous buck converter, or a portion of any of these circuits. In another example, the packaged circuit 100 includes a single die in a single-chip package such as, for example, to implement a power stage IC or a discrete component.

A top surface of the component 116 can be coupled to one or more sections 102-1, 102-2, 102-3 of the lead frame 102 by one or more wire bonds 118, copper clip(s), aluminum ribbon(s), or other interconnect mechanism. The wire bonds 118 can be attached to the internal surface 105 of the lead frame 102 and to the top surface of the component 116. Molding compound 122 can surround the component 116 and extend partially between and around the sections 102-1, 102-2, 102-3 of the lead frame 102. The molding compound 122 can comprise any suitable molding compound such as a thermoset, thermoset epoxy, or thermoplastic. The packaged circuit 100 also includes a solder resist 110 on a bottom edge thereof in between sections 102-1, 102-2, 102-3 of the lead frame 102. The solder resist 110 can be composed of an electrically non-conductive solder mask material (resist), including both organic and non-organic solder mask material. Solder or another die attach adhesive 106 can be used to mechanically attach and electrically and/or thermally couple a bottom surface of the component 116 to the lead frame 102 (e.g., section 102-2).

The packaged circuit 100 also includes one or more solder flow-impeding plugs 108. A solder flow-impeding plug 108 is disposed between adjacent sections 102-1, 102-2, 102-3 of the lead frame 102 and functions to impede the flow of solder 106 along edges of the sections 102-1, 102-2, 102-3 during second level solder reflow events that occur after encapsulation of the packaged circuit 100. The plug 108 impedes the flow of solder along the edges by plugging the space between adjacent sections 102-1, 102-2, 102-3 and adhering to the sections 102-1, 102-2, 102-3. More detail regarding the plug 108 is provided below.

Figure 1B:
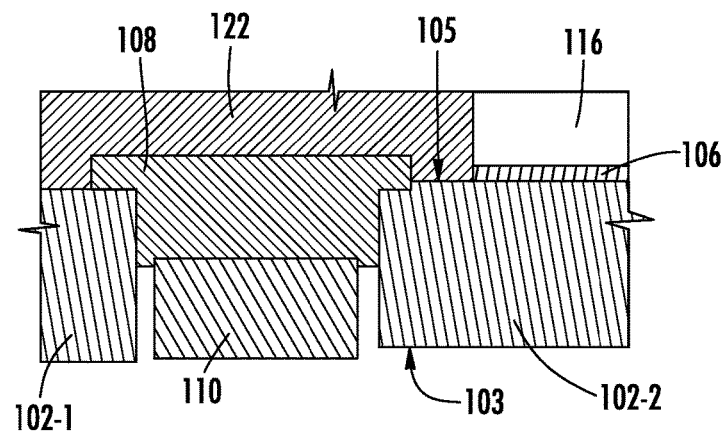
FIG. 1B is an enlarged cross-sectional view of one example of the solder flow-impeding plug and adjacent lead frame of FIG. 1A.

FIG. 2B is an enlarged cross-sectional view of the solder flow-impeding plug 108 and adjacent sections 102-1, 102-2 of the lead frame 102. The plug 108 illustrated in FIG. 1B is disposed between section 102-1 and section 102-2. The plug 108 adheres to the sections 102-1 and 102-2, in particular to the edges of the sections 102-1 and 102-2, such that, ideally, there is limited or no space for solder 106 to flow from the internal surface 105 to the external surface 103. In the examples shown herein, in addition to adhering to the edges of the sections 102-1, 102-2, the plug 108 also includes overlap portions that overlap onto and adhere to a portion of the internal surface 105 of the sections 102-1, 102-2 to further impede the flow of solder 108.

The plug 108 is composed of an electrically non-conductive material that is adhesive to metal (the lead frame 102), such as a solder mask material (e.g., resist), and can include organic and non-organic solder mask material. As a solder mask material, the plug 108 adheres more strongly to the metal lead frame 102 than to the molding compound 122. This helps ensure that the plug 108 remains adhered to the sections 102-1, 102-2, 102-3 of the lead frame 102 during handling of the packaged circuit 100 after encapsulation.

Figure 2:
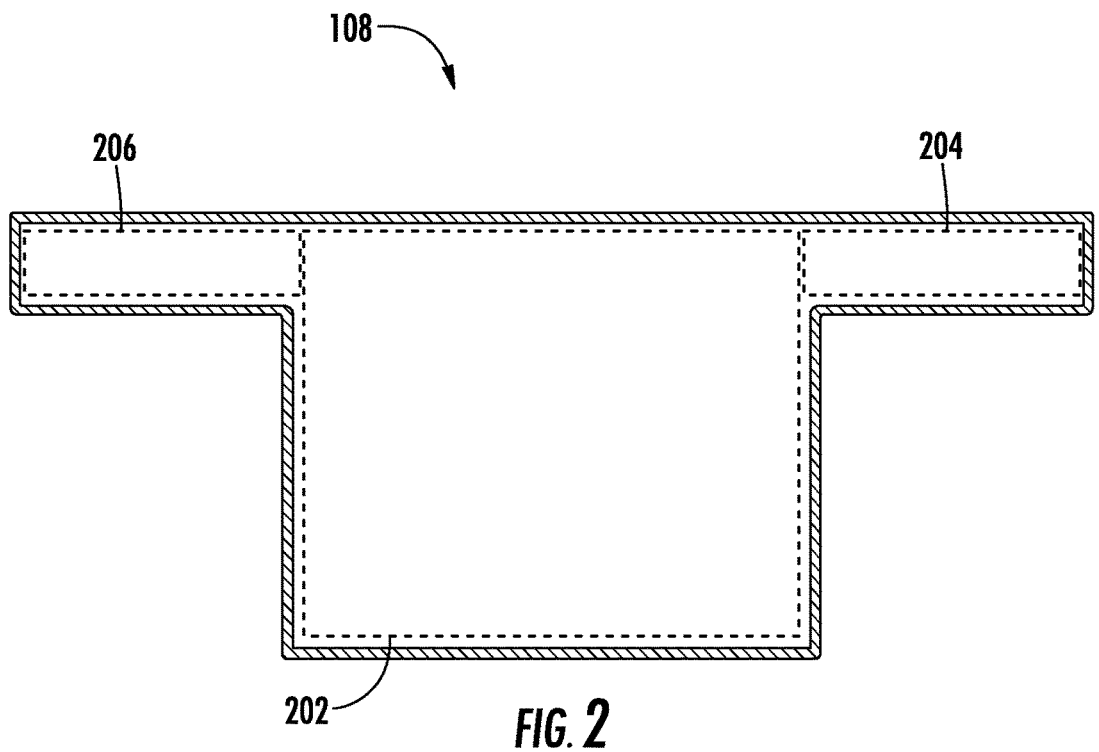
FIG. 2 is a cross-sectional view of an embodiment of the solder flow-impeding plug of FIGS. 1A and 1B.

FIG. 2 illustrates an enlarged cross-sectional view of the solder flow-impeding plug 108 individually. In the examples illustrated in FIGS. 1A, 1B, and 2, the plug has a general "T" shape comprising a main body 202 with an overlap portion 204, 206 on each side of the internal portion of the main body 202. The main body 202 is the portion of the plug 108 that is between the sections 102-1, 102-2, 102-3. Most of the main body 202 is below (toward the external surface 103) the internal surface 105 of the sections 102-1, 102-2, 102-3. The main body 202 has dimensions that fill the space between adjacent sections 102-1, 102-2, 102-3 of the lead frame 102. The overlap portions 204, 206 of the plug 108 are the portions of the plug 108 on the internal side of the main portion 202 that overlap the internal surface 105 of the adjacent sections 102-1, 102-2. The overlap portions 204, 206 of the plug 108 extend laterally wider than the main portion. The overlap portions 204, 206, therefore, extend wider than the space between adjacent sections 102-1, 102-2, 102-3 in order to overlap the internal surface 105 of the sections 102-1, 102-2, 102-3. In one example, the overlap portions 204, 206 extend between 100 and 500 microns outward from the main body 202 to overlap the adjacent sections 102-1, 102-2, 102-3. Although two overlap portions 204, 206 are shown in the cross-sections of FIGS. 1A, 1B, and 2; it should be understood that the plug 108 can have overlap portions on all sides that abut a section of the lead frame 102.

The plug 108 is configured to impede the free flow of the solder or other die attach adhesive 106 during a reflow event. Hereinafter the solder or other die attach adhesive 106 is referred to simply as "solder 106", however, it should be understood that other die attach adhesives can be used. Additionally, since the plug 108 adheres to both adjacent sections 102-1, 102-2, 102-3, the plug 108 forms a mechanical couple between the adjacent sections 102-1, 102-2, 102-3. Moreover, in addition to impeding the flow of solder 106 out, the plug 108 also acts as a barrier to entry into the packaged circuit 100 and can, for example, reduce the ingress of moisture and external contaminants into the packaged circuit 100.

Figure 3:
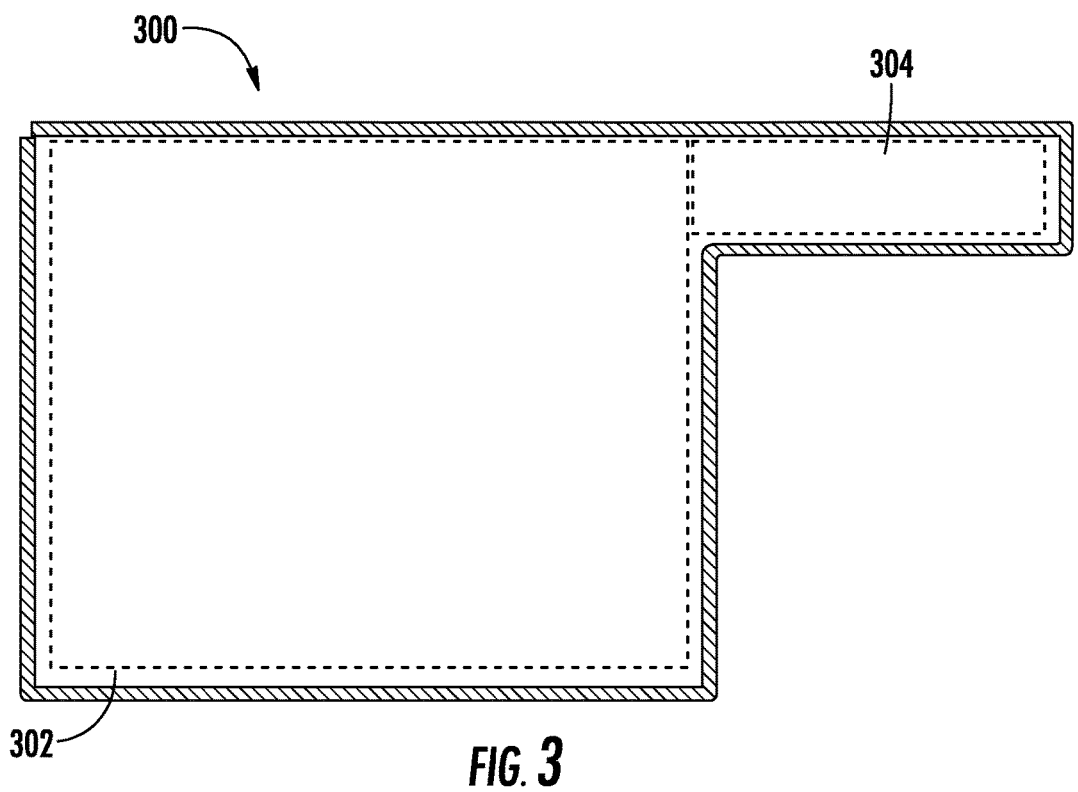
FIG. 3 is an enlarged cross-sectional view of an alternative embodiment of a solder flow-impeding plug and adjacent lead frame.

FIG. 3 is a cross-sectional view of an alternative embodiment of a solder flow-impeding plug 300. This alternative solder flow-impeding plug 300 a main body 302 and an overlap portion 304 on one side of the internal portion of the main body 302, but does not have an overlap portion on the opposite side of the internal portion of the main body 302. Similar to plug 108, the main body 302 is the portion of the plug 300 that is between adjacent sections of the lead frame, where most of the main body 302 is below the internal surface (105) of the adjacent sections. The overlap portion 304 of the plug 300 is similar to the overlap portion 204 of plug 108; however, the opposite side of plug 300 does not have such an overlap portion. The side of plug 300 not having an overlap portion does not substantially overlap the internal surface of adjacent sections of the lead frame. An overlap portion may not be included on one or more sides of the plug 300 in order to reduce the area on the internal surface of the lead frame used by the plug 300. Such a reduction in area may allow the lead frame to be smaller or may allow the area on the internal surface that would otherwise have been covered by the overlap portion to be used for other purposes, such as attachment of a lead. In an example, an overlap portion 304 may be included on sides of the plug 300 that are adjacent a large amount of solder, such as the solder 106 used to attach the bottom surface of component 116, while sides of the plug 300 that have little or no solder adjacent thereto do not have an overlap portion. As should be understood, an overlap portion 304 can be located on any one or more of the sides of a plug 300 as desired.

The solder flow-impeding plug 300 is composed of an electrically non-conductive material that is adhesive to metal (the lead frame 102), such as a solder mask material (e.g., resist), and can include organic and non-organic solder mask material. As a solder mask material, the plug 300 adheres to adjacent sections of a lead frame. Such a plug 300 having an overlap portion 304 on one or more sides and no overlap portion on one or more other sides can still impede the free flow of solder 106 during a reflow event. This is true even for sides not having an overlap portion. Since the main body 302 fills the space between adjacent sections of the lead frame and adheres to the edge of such sections, the main body 202 will impede the free flow of solder 106 between the sections. Comparatively more impedance, however, may be provided at the one or more sides having an overlap portion 304.

Figure 4:
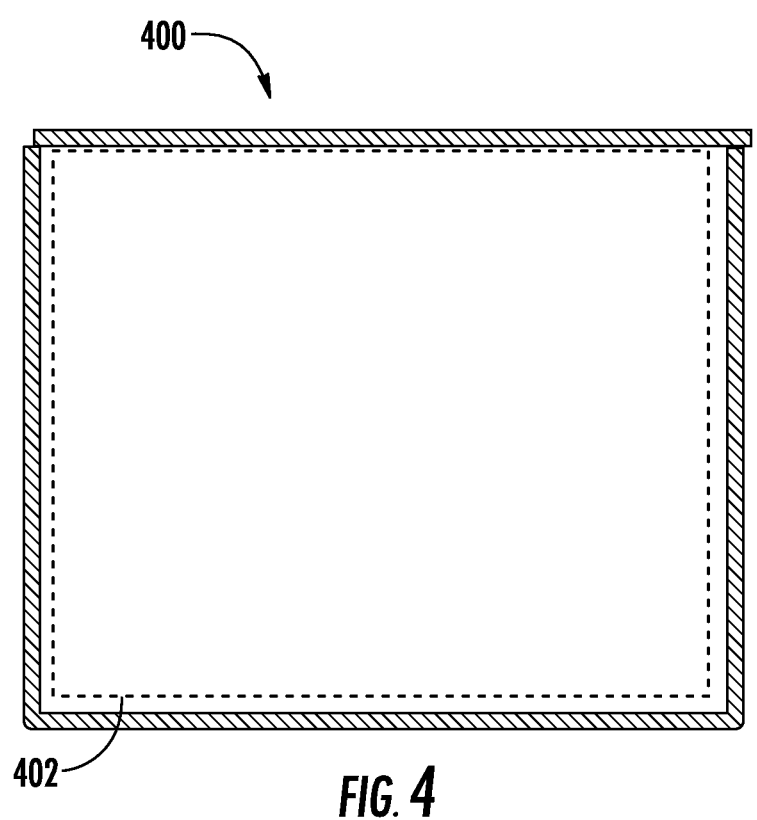
FIG. 4 is an enlarged cross-sectional view of yet another embodiment of a solder flow-impeding plug and adjacent lead frame.

FIG. 4 is a cross-sectional view of yet another embodiment of a solder flow-impeding plug 400. The solder flow-impeding plug 400 includes a main body 402 without any overlap portions. Similar to plug 108, the main body 402 is the portion of the plug 400 that is between adjacent sections of the lead frame, where most of the main body 402 is below the internal surface (105) of the adjacent sections. On plug 400, however, none of the sides includes an overlap portion, which substantially overlaps the internal surface of adjacent sections of the lead frame. Such a solder flow-impeding plug 400 can be used to increase the area of the internal surface available for other uses. The solder flow-impeding plug 400 is composed of an electrically non-conductive material that is adhesive to metal (the lead frame 102), such as a solder mask material (e.g., resist), and can include organic and non-organic solder mask material. As a solder mask material, the plug 400 adheres to adjacent sections of a lead frame.

Figure 5:
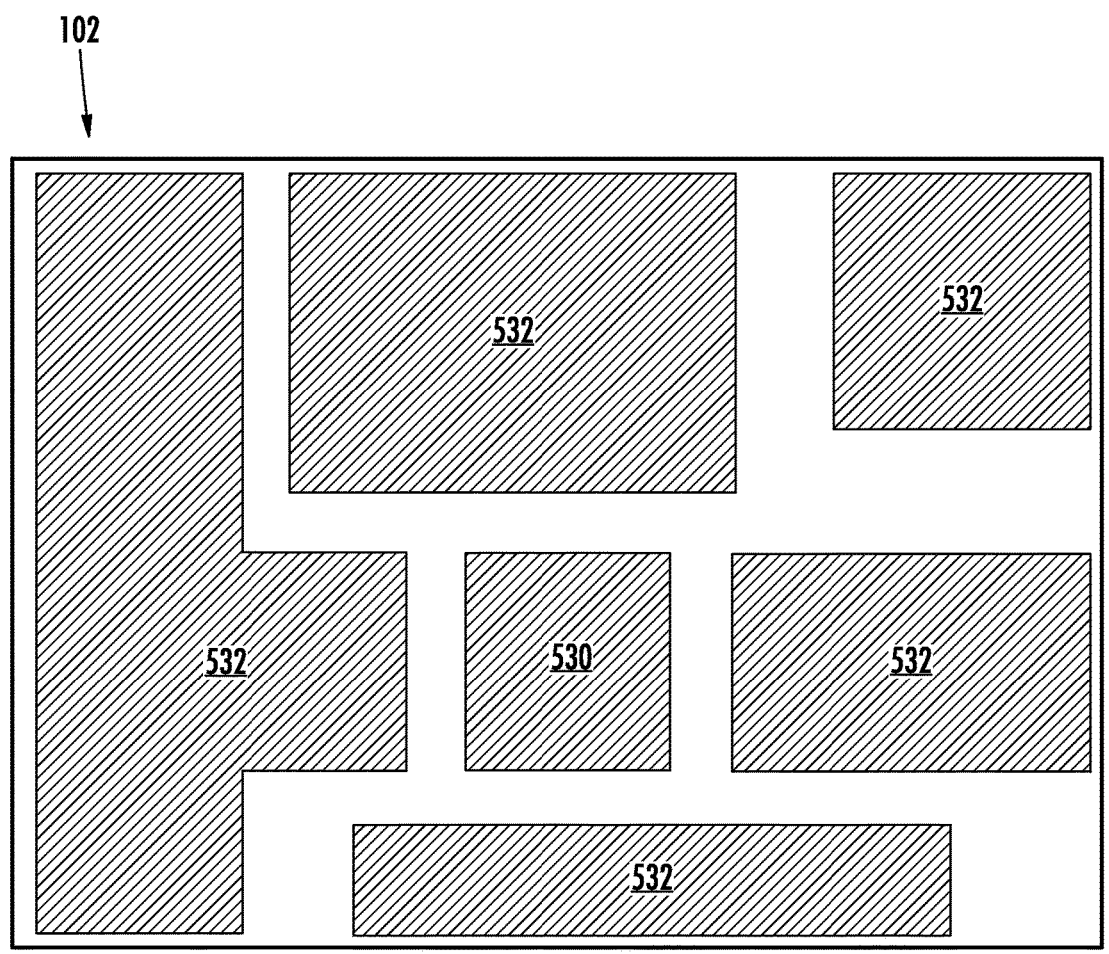
FIG. 5 is a top cross-sectional view of the lead frame of FIG. 1.

FIG. 5 is a top cross-sectional view of an example lead frame 102 for the packaged circuit 100. As shown, the lead frame 102 includes both edge sections 532 and a floating section 530; with the edge sections 532 abutting at least one edge of the packaged circuit 100 and the floating section 530 that does not abut an edge of the packaged circuit 100. Although in this example only a single floating section 530 is shown, other examples can include more than one floating section 530. The edge sections 532 and floating section 530 can include any appropriate external terminal(s) such as a pad or lead.

Manufacturing the circuit 100 into a package can include manufacturing a plurality of the packaged circuits 100 at the same time. Accordingly, a plurality of chip lead frames 102 can be assembled adjacent to one another, each having appropriate components 116 mounted thereon. Once assembled, the lead frames 102 and associated components can be singulated to form the individual packaged systems.

The following description refers to the process of forming a single packaged circuit 100, but it should be understood that the process can involve forming a plurality of packaged circuits 100 at the same time.

FIGS. 6A-6I are cross-sectional views of example stages in a method of manufacturing a packaged circuit including one or more solder flow-impeding plugs 108. The lead frame 102 and one or more components 116 to be mounted thereon are obtained. The component(s) can be fabricated as a die (e.g., a monolithic substrate) using appropriate semiconductor processes. FIG. 6A shows a blank lead frame 102.

The lead frame 102 can be partially etched, as a first partial etch, from the internal (top) surface 105 along dividing lines 601, which correspond to the spaces between sections of the final lead frame 102. The first partial etch is referred to as a "partial" etch since the first partial etch extends only a portion of the way through the lead frame 102 from the internal surface 105 to the external (bottom) surface 103. The first partial etch results in a lead frame 102 having a plurality of trenches 602 defined in the internal surface 105 as shown in FIG. 6B. To perform the first partial etch, resist is placed on the internal surface 105 of the lead frame 102, but resist is not placed on the dividing lines 601 where the lead frame 102 is to be removed with the etch. In an example, the first partial etch extends between 50 and 75% of the way through the lead frame 102 and, in a particular example, extends around 62% of the way through the lead frame 102 which can be about 0.125 mm into the top surface. In other examples, the first partial etch can extend in other distances. After the first partial etch, plating 604 can be deposited on the internal surface 105 of the lead frame 102 as shown in FIG. 5C.

After the first partial etch and before the second partial etch described below and placement of the molding compound 122, the plug 108 is formed in the trench 602 formed by the first partial etch as shown in FIG. 6D. In an example, the plug 108 is formed by screen-printing solder mask material into the trench 602. At a minimum sufficient solder mask material is applied into the trench 602 such that the resulting plug 108 extends all the way across the trench 602 and adheres to both sides. In a particular example, sufficient solder mask material is applied into the trench 602 to substantially fill the trench 602 up to or beyond the internal surface 105 of the lead frame 102. In examples where the plug 108 includes an overlap portion, the screen printing is controlled such that the solder mask material is deposited onto portions of the internal surface 105 of the lead frame 102 adjacent the trench 602 on sides in which such an overlap portion is desired. Advantageously, applying the material for the plug 108 prior to mounting the component(s) 116 can improve adhesion properties between the plug 108 and the lead frame 102 by allowing the plug 108 to adhere to the lead frame 102 prior to subjecting it to temperature excursions and the introduction of contaminants by upstream assembly processes before final encapsulation such as mounting of the component(s) 116 or wire bonding interconnects. Moreover, the edge formed by the plug 108 can be used to assist alignment of the component(s) 116 when mounting and the edge can help control solder 106 during first level solder reflow.

Figure 7A:
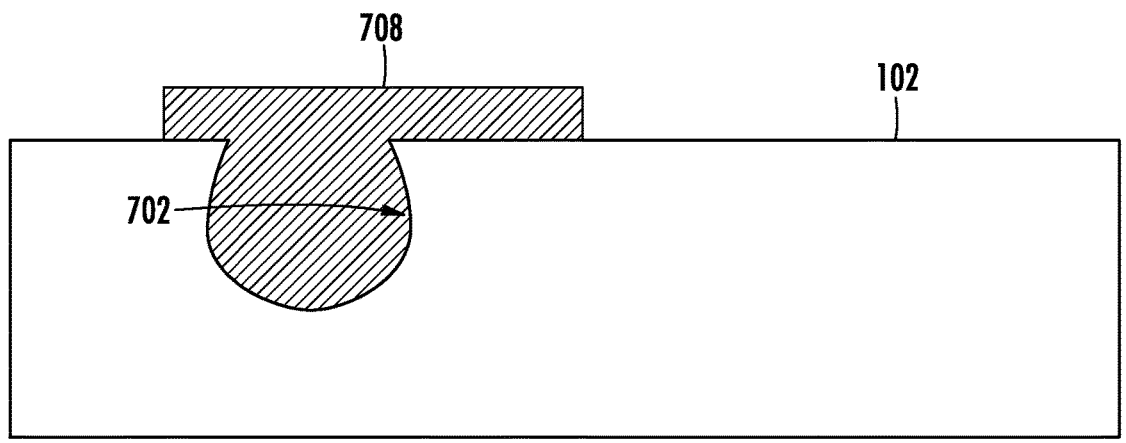
FIG. 7A is an enlarged cross-sectional view of another example of the stage shown in FIG. 6D of a solder flow-impeding plug in a lead frame.

FIG. 7A is an enlarged cross-sectional view of another example of the stage shown in FIG. 6D of a solder flow-impeding plug 708 in a lead frame 102. In the example shown in FIG. 7A, the trench 702 formed by the first partial etch has a rounded profile characteristic of the etching process. In conformance with the rounded profile, the solder flow-impeding plug 708 also has a rounded shape. It should be understood that a solder flow-impeding plug 108, 708 can have any desired cross-sectional profile.

Figure 7B:
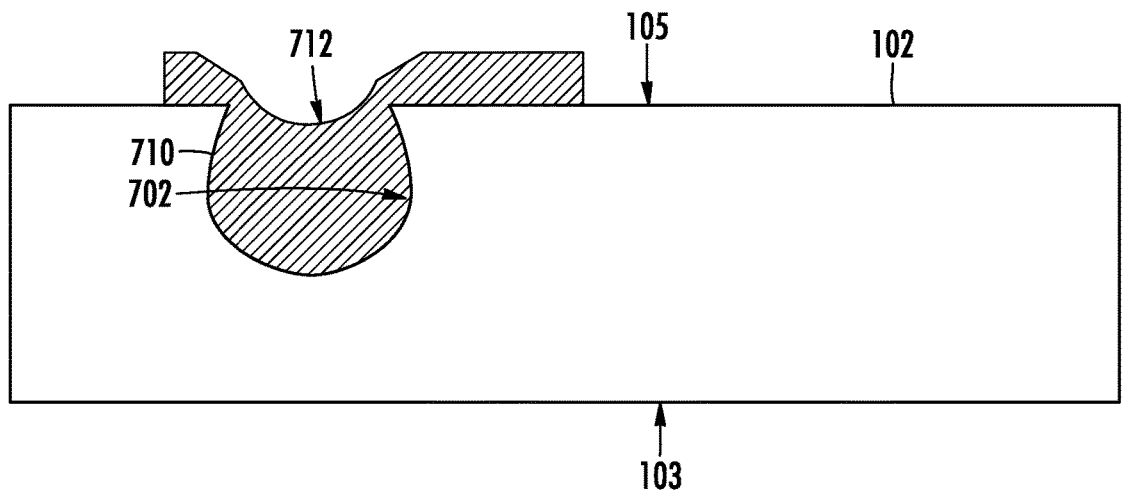
FIG. 7B is an enlarged cross-sectional view of yet another example of the stage shown in FIG. 6D of a solder flow-impeding plug in a lead frame.

FIG. 7B is an enlarged cross-sectional view of another example of the stage shown in FIG. 6D of a solder flow-impeding plug 710 in a lead frame 102. In the example shown in FIG. 7B, the exposed surface 712 of the solder flow-impeding plug 710 is recessed above the trench 702, instead of being flat as shown in FIG. 7A. The recessed surface 712 is formed as a natural consequence of the solder mask material being applied to both the internal surface 105 and the trench 702 which are not even with one another. That is, as the solder mask material for the solder flow-impeding plug 710 is applied into the trench 702 and to the internal surface 105 of the lead frame 102, the solder mask material will naturally form a recessed surface due to the different surface levels of the internal surface 105 and the trench 702 unless other measures are taken to counter this effect. It should be understood that the surface 712 of the solder flow-impeding plug 712 can have a recess of any depth or no recess at all (i.e., flat) as desired.

Once the solder mask material for the plug 108 is applied into the trench 602, the component(s) 116 can be mounted on solder paste 106 on the internal surface 105 of the lead frame 102 as shown in FIG. 6E. In an example, the internal surface 105 of the lead frame 102 can be coated with the solder paste 106 using a solder mask and solder paint or a plurality of solder balls. In any case, the component 116 can be aligned with and placed on the lead frame 102, for example, using flip-chip mounting techniques. In particular, each component 116 can be placed such that it is mounted to a future section (102-1, 102-2, 102-3) of the lead frame 102. As used herein a future section of the lead frame 102 refers to a portion of the lead frame 102 that will be disconnected from other portions of the lead frame 102 after the second partial etch described herein. In some examples, the solder 106 can be reflowed once the component(s) 116 are in position on the lead frame 102.

In some examples, wire bond(s) 118, copper clip(s), aluminum ribbon(s), or other interconnect mechanism can be attached to the component(s) 116 and lead frame 102 to achieve desired coupling as shown in FIG. 6F. Once the component(s) 116 have been mounted and all appropriate electrical connections have been made, molding compound 122 can be flowed over the component(s) 116 and the lead frame 102 to encapsulate the component(s) 116 and the lead frame 102. In a process forming a plurality of packaged circuits at the same time, molding compound 122 can be flowed over the plurality of assembled circuits. Once applied, the molding compound 122 can be cured resulting in the structure shown in FIG. 6G.

Once the molding compound 122 is cured, the external surface 103 of the lead frame 102 can be etched as a second partial etch as shown in FIG. 6H. The second partial etch can overlap the dividing lines 601 between future sections of the lead frame. Similar to the first partial etch, the second partial etch extends a portion of the way through the lead frame from the external surface 103 toward the internal surface 105. The second partial etch can be aligned with the first partial etch and extend through the lead frame 102 enough to meet the first partial etch such that the plug 108 formed therein is exposed on the external surface 103 side of the lead frame 102. The second partial etch can disconnect and electrically de-couple different sections 102-1, 102-2, 102-3 of the lead frame 102 at the dividing lines 601. That is, the second partial bottom etch occurs at a location on the lead frame 102 opposite the first partial etch such that the combination of the first partial etch and the second partial etch etches entirely through the lead frame 102 and disconnects different sections of the lead frame 102 from one another. In an example, the second partial etch removes a laterally wider portion of the lead frame 102 than the first partial etch. The second partial etch results in one or more trenches 608 defined in the external surface 103. To perform the section partial etch a resist is placed on the external surface 105 of the lead frame 102, but resist is not is placed on the dividing lines 601.

After the second partial etch is complete, an electrically non-conductive material, such as a solder mask material (e.g., resist) 110 can be applied from the external surface 103 side, between the sections 102-1, 102-2, 102-3 of the lead frame 102 and wherever else appropriate resulting in the packaged circuit 100 shown in FIG. 6I. The solder mask material can include organic and non-organic solder mask material. Additionally, input/output land plating, solder, or the like can be applied to the external surface 103 of the lead frame 102.

When forming a plurality of packaged circuits at the same time, the combined multiple packaged circuits can then be singulated to form a plurality of packaged circuits.

Figure 8:
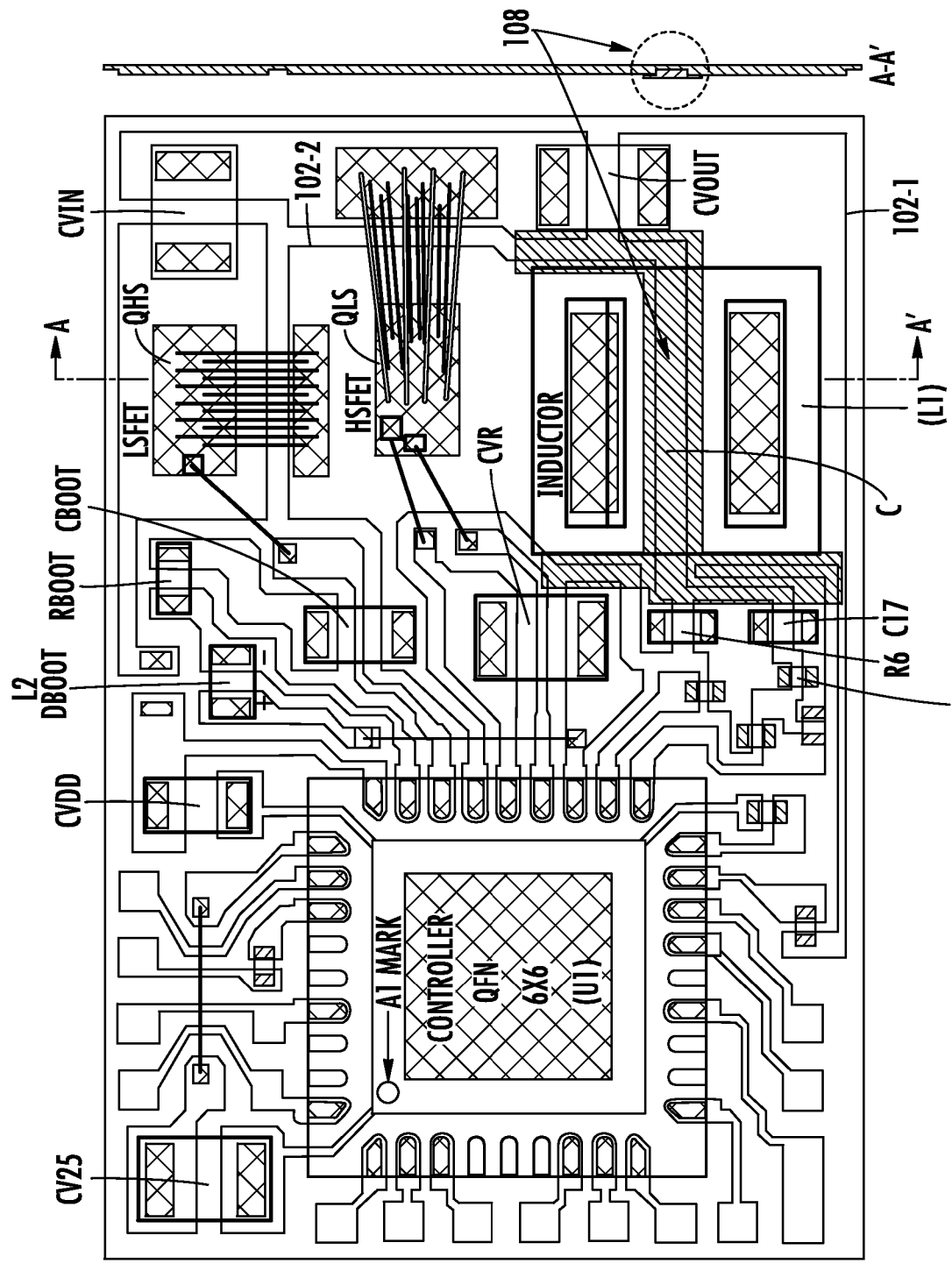
FIG. 8 is a plan view of an example of a packaged circuit including a solder flow-impeding plug.

FIG. 8 is a circuit plan view of an internal surface of an example packaged circuit 100 showing example plugs 108. As shown, the plugs 108 are disposed between adjacent sections 102-1, 102-2, 102-3 of the lead frame 102. The plugs 108 can extend laterally along the boundaries between sections 102-1, 102-2, 102-3 of the lead frame 102 as shown. As shown, some sections 102-1, 102-2, 102-3 of the lead frame 102 can have a plug 108 therebetween while other sections do not have such a plug 108.

The directional references top and bottom stated and illustrated in this application should not be taken as limiting. The directions top and bottom are merely illustrative and do not correspond to absolute orientations. That is, a "top" or "bottom" surface refers merely to a relative orientation with respect to the lead frame and is not an absolute direction. For example, in actual electronic applications, a packaged chip may well be turned on its "side", causing the "bottom surface" described herein to face sidewise.

What is claimed is:

1. A packaged component comprising:
   a lead frame having a plurality of electrically isolated sections of conductive material;
   a non-conductive plug disposed between two or more adjacent sections of the lead frame, wherein the plug is composed of a non-conductive material and functions to impede the flow of solder during second level solder reflow events that occur after encapsulation of the packaged component, wherein the plug includes:
      a main portion disposed within a space between the two or more adjacent sections and
      one or more overlap portions extending from the main portion, the one or more overlap portions disposed on an internal surface of at least one of the two or more adjacent sections; and
   at least one component mounted on one of the plurality of sections of the lead frame.

2. The packaged component of claim 1, wherein the main portion extends across a space between the two or more adjacent sections.

3. The packaged component of claim 2, wherein the main portion fills the space at least up to the internal surface of the two or more adjacent sections.

4. The packaged component of claim 3, wherein the one or more overlap portions are disposed on an internal surface of all of the two or more adjacent sections.

5. The packaged component of claim 1, wherein the non-conductive plug is composed of a solder mask material.

6. The packaged component of claim 1, comprising:
   solder between the at least one component and the one of the plurality of sections of the lead frame, wherein the at least one component is flip-chip mounted to the one of the plurality of sections of the lead frame.

7. The packaged component of claim 1, wherein the plurality of sections of the lead frame include at least one floating section that does not abut against an edge of the lead frame.

8. The packaged component of claim 1, comprising:
   a solder mask material on portions of an external surface of the lead frame.

9. The packaged component of claim 1, comprising:
   molding compound on the lead frame and around the at least one component.

* * * * *